(12) United States Patent
Vashchenko et al.

(10) Patent No.: US 7,910,950 B1
(45) Date of Patent: Mar. 22, 2011

(54) HIGH VOLTAGE ESD LDMOS-SCR WITH GATE REFERENCE VOLTAGE

(75) Inventors: Vladislav Vashchenko, Palo Alto, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 1003 days.

(21) Appl. No.: 11/403,599

(22) Filed: Apr. 13, 2006

(51) Int. Cl.
*H01L 29/66* (2006.01)
(52) U.S. Cl. .................... 257/124; 257/E29.04
(58) Field of Classification Search ............ 257/124, 257/E29.04
See application file for complete search history.

(56) References Cited

U.S. PATENT DOCUMENTS

| | | | | |
|---|---|---|---|---|
| 6,137,140 A | * | 10/2000 | Efland et al. | 257/343 |
| 6,750,515 B2 | * | 6/2004 | Ker et al. | 257/357 |
| 2001/0053581 A1 | * | 12/2001 | Mosher et al. | 438/297 |

* cited by examiner

*Primary Examiner* — Bradley K Smith
*Assistant Examiner* — Amar Movva
(74) *Attorney, Agent, or Firm* — Jurgen K. Volrath; Volrath & Associates

(57) ABSTRACT

In an LDMOS-SCR ESD protection structure gate voltage of an ESD protection LDSCR is defined by connecting the gate to the source of a reference LDSCR. The reference LDSCR is implemented as a self-triggering device in which the snap-back drain-source voltage (avalanche breakdown voltage) is controlled to be lower than that for the major LDSCR by adjusting the RESURF layer-composite overlap for the reference LDSCR to be different to that of the major LDSCR.

12 Claims, 3 Drawing Sheets

HIGH VOLTAGE ESD LDMOS-SCR WITH GATE REFERENCE VOLTAGE

FIELD OF THE INVENTION

The invention relates to ESD devices. In particular it relates to ESD protection for high voltage and high speed devices.

BACKGROUND OF THE INVENTION

Electrostatic discharge (ESD) protection of high speed devices such as the protection of switch pins that extend to switch nodes with a fast rise time requirement, encounters problems when it comes to dealing with high voltages. The high voltage requirements are typically addressed by making use of an array having multiple fingers defining the protection device, to handle the high currents. However, multiple fingers invariably increase the footprint of the device, which implies a large parasitic capacitance associated with the array. This in turn is incompatible with the fast rise time requirement of the switch node.

Furthermore, in the case of LDMOS-SCR devices it has been found that drain-source avalanche breakdown cannot be used to reliably turn on the device since the extended drain in such a device acts as a saturation resistor which disperses the turn-on voltage. Therefore snapback of the device cannot be achieved reliably. Thus, a circuit such as that shown in FIG. 1, which makes use of an LDMOS-SCR 100 to protect a switch node 102, and which relies on avalanche breakdown to turn on, does not provide for a reliable solution.

Gate turn-off (GTO) thyristors have, in the past been used to provide precise turn-on by using the gate electrode as a control electrode.

The present invention seeks to provide a solution to these problems while making use of an LDMOS-SCR device.

SUMMARY OF THE INVENTION

According to the invention, there is provided an LDMOS-SCR (LDSCR) ESD protection structure comprising a reference LDSCR device having a drain, a source and a gate; and a major LDSCR device, having a drain, a source and a gate, wherein current from the reference LDSCR device is used to control the voltage on the gate of the major LDSCR device. The reference LDSCR device and major LDSCR device may be part of the same overall LDSCR device, wherein the overall LDSCR device includes multiple legs defining an LDSCR array and the reference LDSCR device is defined by one of the legs. The major LDSCR device may include one or more legs of an LDSCR array, either as part of the same array as the reference LDSCR device or as a separate LDSCR array. The source of the reference LDSCR device may be connected to the gate of the major LDSCR device, either directly or through a separate polysilicon (poly) resistor. Typically the gate of the major LDSCR device is connected to ground through a gate resistor to define the voltage on the gate of the major LDSCR device. Typically, the reference LDSCR device and major LDSCR device each include a p-well in which their respective sources are formed. The gate resistor may be defined by the inherent resistance of the p-well of the major LDSCR (PLEASE CONFIRM), or may include a separate poly resistor. The reference LDSCR device may include a reduced surface field layer (RESURF layer), which may be defined by the p-well of the reference LDSCR device or by another RESURF layer and which defines a p-well-composite overlap in the reference LDSCR device. The major LDSCR device may also include a reduced surface field layer (RESURF layer), which may be defined by the p-well of the major LDSCR device or by another RESURF layer and which defines a p-well-composite overlap in the major LDSCR device. Preferably the p-well-composite overlap in the reference device is different from the p-well-composite overlap in the major LDSCR device. The reference LDSCR device is typically implemented as a self-triggering snapback device with the gate of the reference LDSCR device connected directly or through a resistor to its source. The relative p-well-composite overlaps in the reference LDSCR device and the major LDSCR device are typically chosen to provide a lower triggering voltage in the reference LDSCR device than in the major LDSCR device.

Further, according to the invention, there is provided a method of controlling the triggering voltage on an LDSCR by providing a RESURF mask for forming a RESURF layer, and adjusting the RESURF mask to adjust the length of the RESURF layer to achieve a desired RESURF-composite overlap.

Still further, according to the invention, there is provided a method of controlling the turn on voltage of a LDSCR ESD protection structure, comprising controlling the gate voltage of the LDSCR ESD protection structure by means of an avalanche current from a self-triggered reference LDSCR. The LDSCR ESD protection structure may comprise an LDSCR array having multiple legs. The reference LDSCR may be defined by one leg of such an LDSCR array, in which case said one leg is typically implemented to have a triggering voltage that is lower than that of the other legs of the array. The triggering voltage of said one leg or the other legs or of both said one leg and said other legs may be adjusted by providing for each leg whose triggering voltage is to be adjusted, a RESURF mask for forming a RESURF layer, and adjusting the RESURF mask to adjust the length of the RESURF layer to achieve a desired RESURF-composite overlap.

DETAILED DESCRIPTION OF THE INVENTION

Simulation results show that snapback drain-source voltage is a strong function of gate-source voltage. The present invention therefore provides for an LDMOS-SCR ESD protection solution usable in high frequency, high voltage application (such as in the protection of switching pins) that makes use of gate control of the ESD protection device.

Figure 1:
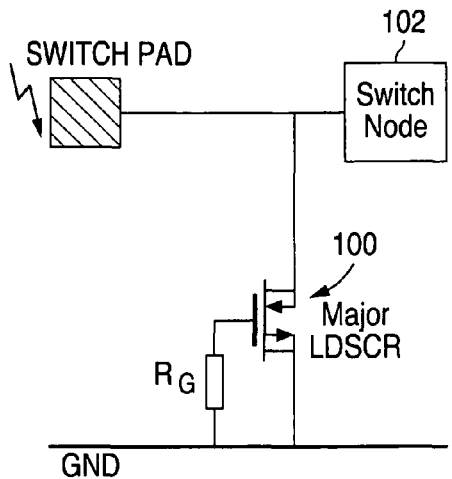
FIG. 1 shows a schematic circuit diagram of an undesirable arrangement for an LDMOS-SCR ESD protection circuit.
Figure 2:
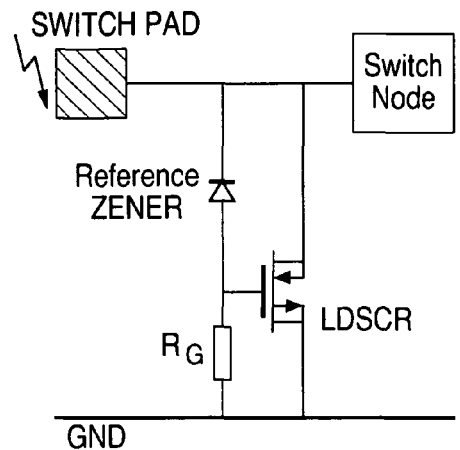
FIG. 2 shows a schematic diagram of another undesirable arrangement for an LDMOS-SCR ESD protection circuit.

While a zener diode could theoretically be used to control the gate voltage of the LDMOS-SCR, as shown in FIG. 2, this is not an optimum solution, since precise zener diodes are hard to obtain and a proper zener does not exist in the device as a free device, thus requiring extra process steps to implement.

The present invention instead makes use of the internal structure of the LDMOS-SCR (LDSCR) to provide for gate control. In particular, the present invention makes use of one LDSCR to act as reference LDSCR for an LDSCR array, which defines the major LDSCR and thus the actual ESD protection device.

Figure 3:
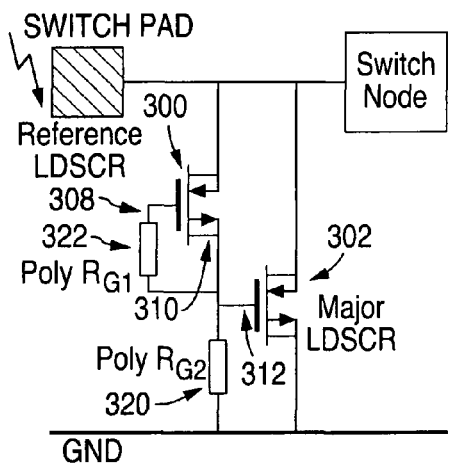
FIG. 3 shows a schematic circuit diagram of one embodiment of the invention.
Figure 4:
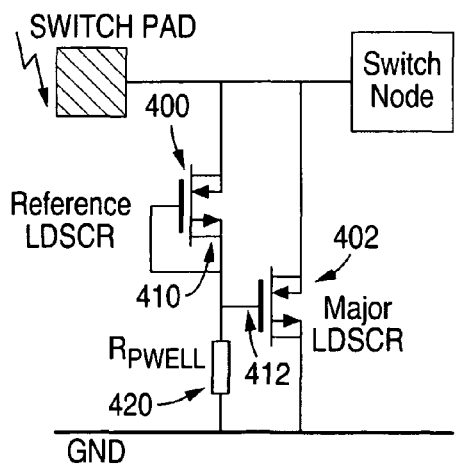
FIG. 4 shows a schematic circuit diagram of another embodiment of the invention.
Figure 5:
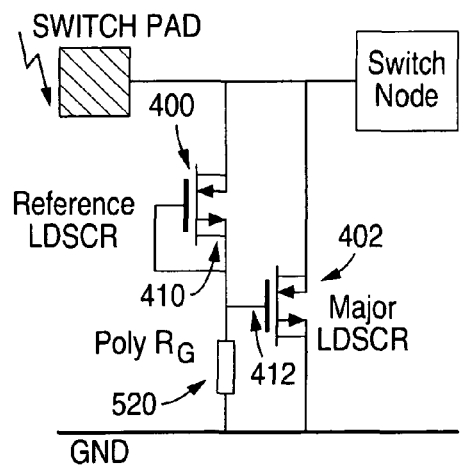
FIG. 5 shows a schematic circuit diagram of yet another embodiment of the invention.

By way of example three embodiments of the invention are shown in FIGS. 3 to 5. In FIG. 3 reference LDSCR 300 constitutes a separate device from the major LDSCR 302, which in this embodiment is implemented as an array to handle the high currents in a high voltage application. As mentioned above, snapback drain-source voltage is a strong function of gate-source voltage. Accordingly, the reference LDSCR is used to control the gate-source voltage of the major LDSCR by having the source 310 of the reference LDSCR connected to the gate 312 of the major LDSCR. In order to provide the gate 312 with the desired voltage, as discussed further below, a poly resistor 320 connects the gate 312 to ground. As shown in FIG. 3, the reference LDSCR is implemented as a self triggering device and has its gate 308 connected to its source 310, the triggering voltage being defined by manipulating the p-well RESURF (Reduced Surface Field) mask, as is discussed in greater detail below. In this case a second poly resistor 322 is provided between the gate and source of the reference LDSCR 300.

A second embodiment of the invention is shown in FIG. 4, in which the reference LDSCR is not a separate LDSCR but constitutes one of the fingers of the LDSCR array. Thus reference LDSCR 400, which is implemented as a self triggering structure by having its gate connected to its source, is part of the same array as the major LDSCR 402. The reference LDSCR 400 again has its source 410 connected to the gate 412 of the major LDSCR 402. In this embodiment the p-well of the LDSCR acts as the resistor 420 that connects the gate 412 of the major LDSCR 402 to ground.

In the third embodiment shown in FIG. 5, the arrangement is essentially the same as in FIG. 4, but instead of relying on the p-well to provide the resistance for controlling the gate voltage to the major LDSCR, the FIG. 5 embodiment makes use of a separate poly resistor 520. Since the rest of the structure remains substantially the same as in FIG. 4, the same reference numerals have been used in FIG. 5 to depict similar elements as in FIG. 4.

The LDSCR arrangement thus works as follows. As the voltage increases above the reference LDSCR avalanche breakdown level, the avalanche breakdown current is realized through the gate resistor 320, 420, 520. The voltage drop on the gate resistor 320, 420, 520 creates a gate bias voltage for the major LDSCR. This results in a reduction of the snapback turn on voltage of the major LDSCR fingers, allowing them to turn on.

Figure 6:
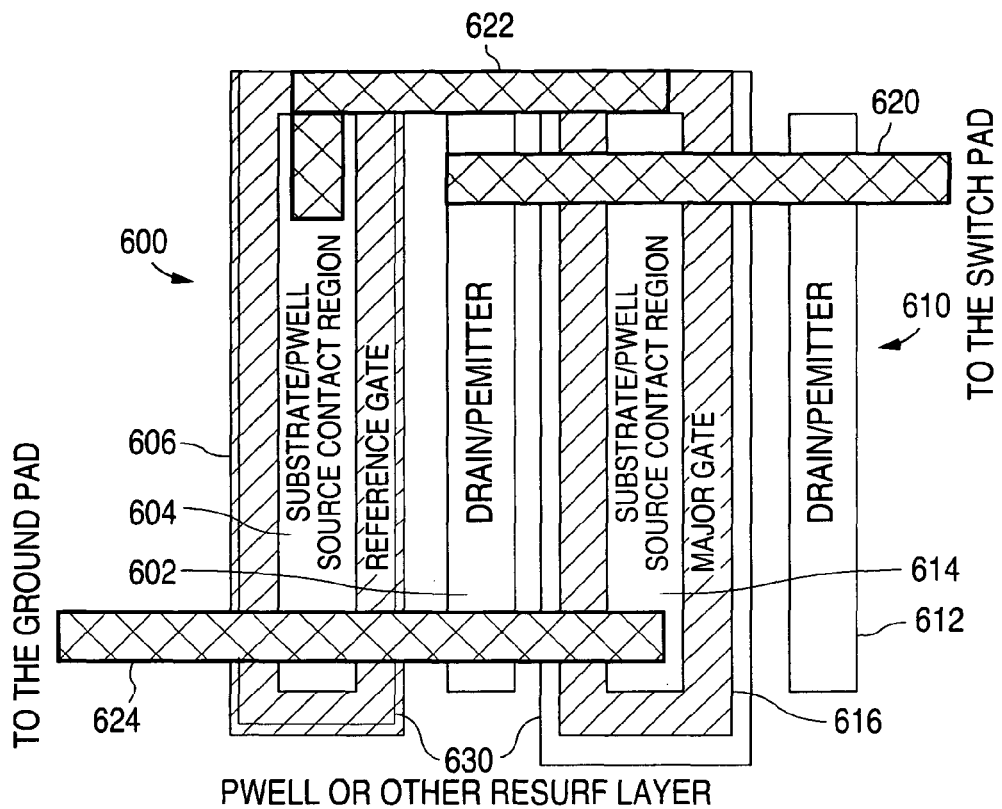
FIG. 6 is a plan view of one embodiment of an LDMOS-SCR ESD structure.

In order to define the avalanche breakdown voltage of the reference LDSCR, the p-well RESURF is adjusted by manipulating the p-well RESURF mask. This is best understood with respect to the plan view of FIG. 6 and the cross-section of FIG. 7. FIG. 6 shows a plan view of an LDSCR array according to one embodiment of the invention. The one leg of the array 600 defines the reference LDSCR and comprises the drain and p-emitter region 602, the substrate, p-well, and source contact region 604, and the gate 606. The remaining legs (in FIG. 6 only one other leg 610 is shown) constitute the major LDSCR. The remaining leg 610 includes a drain and p-emitter region 612, the substrate, p-well, and source contact region 614, and the gate 616. As shown in FIG. 6, the drains 602, 612 are connected by a metal interconnect 620. The metal interconnect 622, in turn, connects the substrate/p-well/source contact region 604 of reference LDMOS 600 to the gate 616 of the major LDSCR 610. The substrate/p-well/source contact region 614 of the major LDSCR is, in turn, connected to ground by the metal interconnect 624. While not shown in FIG. 6, it will be appreciated that a reference resistor will connect the metal 622 to ground. This may be a separate poly resistor such as 320, 520 of FIGS. 3 and 5, or be defined by the p-well itself as was the case with resistor 420 of the FIG. 4 embodiment.

Figure 7:
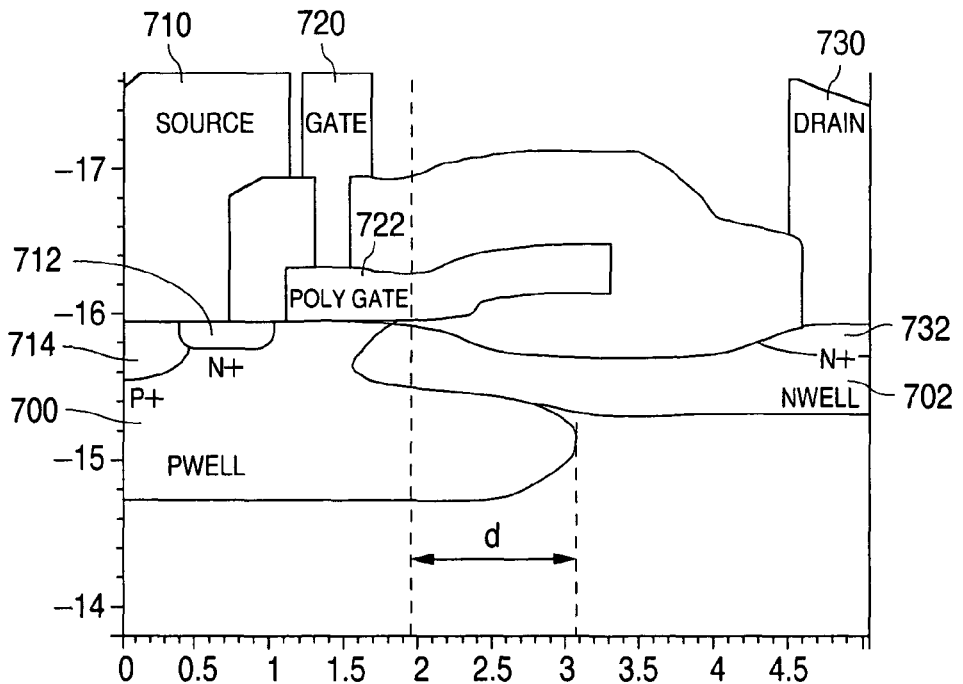
FIG. 7 is a cross-section through one embodiment of an LDMOS-SCR ESD structure of the invention.
Figure 8:
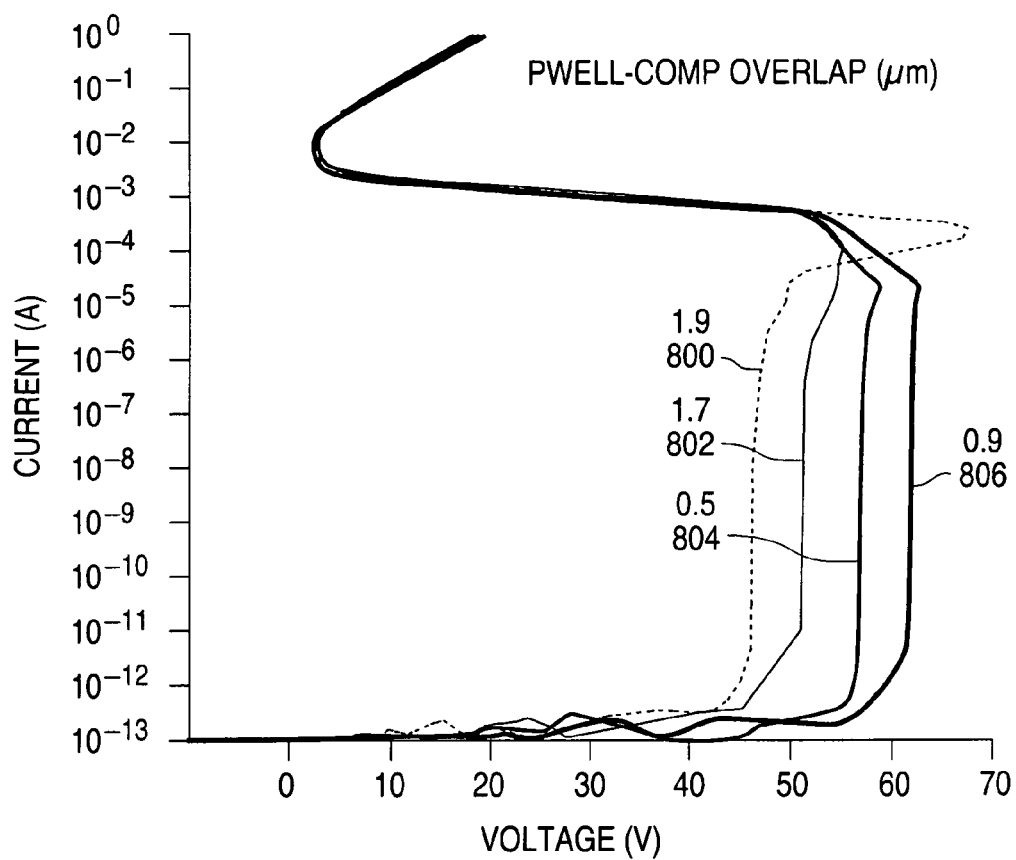
FIG. 8 is a set of I-V curves for an LDMOS with different positions for the RESURF (Reduce Surface Field) p-well position.

FIG. 6 also shows a p-well or other RESURF layer 630, which is best understood with reference to FIG. 7. In FIG. 7 a p-well 700 is implanted to extend under the n-well 702 and thus reduce the surface electric field. As shown in the current vs. voltage curves shown in FIG. 8, TCAD simulations indicate that as the p-well 700 extends further under the n-well composite, referred to herein as the p-well-composite overlap (as defined approximately by the distance d in FIG. 7) the trigger voltage is initially reduced. Thus, for a distance d of 1.9 um, trigger voltage is approximately 40 V (curve 800), for d=1.7 um trigger voltage is approximately 49 V (curve 802), for d=0.5 um the trigger voltage is even higher at about 55 V (curve 804). However, the trigger voltage increases further at this point even though d is not reduced but increased to 0.9 um (curve 806).

Nevertheless, it will be appreciated that by manipulating the RESURF mask used to implant the p-well 700 or other RESURF layer, the trigger voltage of the reference LDSCR can be defined. FIG. 7 also shows the source contact 710 connecting to the source 712, and p+ region 714 of the p-well 700. The gate contact 720 connects to polygate 722. Drain contact 730 connects to the n+ drain region 732 formed in the n-well 702. An oxide 740 is formed on top of the polygate 722 and partially under the polygate 722 and prevents the source contact 710 from contacting the gate contact 720 or polygate 722.

Figure 9:
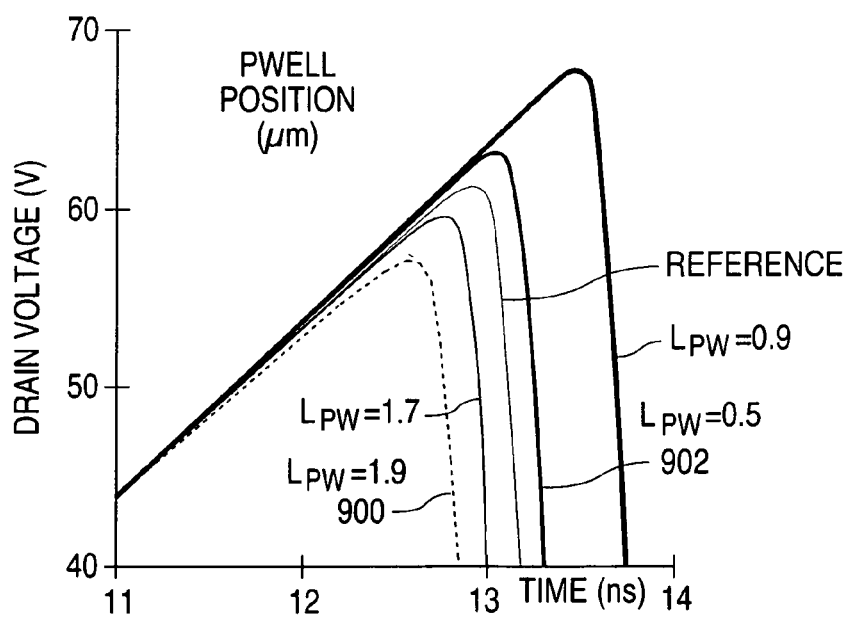
FIG. 9 shows a set of drain voltage vs. time curves for an LDMOS with different positions for the RESURF (Reduce Surface Field) p-well position.

In the time domain, the effect of manipulating the RESURF mask to change the distance d, is shown by the drain voltage vs. time curves of FIG. 9. As shown in FIG. 9, at a distance d=1.9 um (curve 900), drain voltage due to turn on starts coming down after about 12.6 ns, while at d=0.5 um (curve 902) drain voltage only starts coming down after about 13 ns.

Thus, as discussed with respect to the exemplary embodiments above, the present invention provides for gate control of an ESD protection LDSCR (also referred to herein as the major LDSCR and typically implemented as an array or multiple finger device for high voltage applications). The voltage on the gate of the major LDSCR is controlled using a reference LDSCR to achieve controlled turn on of the major LDSCR. The invention also provides a way of adjusting the snapback drain-source voltage (avalanche breakdown voltage) of the reference LDSCR. In particular, in order to ensure earlier (lower voltage) triggering of the reference LDSCR, the RESURF mask for the reference LDSCR is adjusted differently to the RESURF mask for the major LDSCR. By thus adjusting the RESURF layer-composite overlap (referred to in the above embodiments as p-well-composite overlap) for the reference LDSCR and major LDSCR to be different for the reference LDSCR self triggering of the major LDSCR can be avoided. Instead, the major LDSCR is turned on in a controlled fashion by defining its gate voltage. This is evident from the relative locations of the pwell or other RESURF layer 630 in FIG. 6.

While the present invention is described with reference to specific embodiments, the invention is not limited to these embodiments but includes other embodiments as defined by the claims.

What is claimed is:

1. An LDMOS-SCR (LDSCR) ESD protection structure comprising
   a reference LDSCR device having a drain, a source and a gate, and
   a major LDSCR device, having a drain, a source and a gate, wherein the reference LDSCR device is used to control the voltage on the gate of the major LDSCR device, the reference LDSCR device and major LDSCR device being part of the same overall LDSCR device, the overall LDSCR device including multiple legs defining an LDSCR array and the reference LDSCR device being defined by one of the legs.

2. An LDSCR ESD protection structure of claim 1, wherein the source of the reference LDSCR device is connected to the gate of the major LDSCR device.

3. An LDSCR ESD protection structure of claim 2, wherein the gate of the major LDSCR device is connected to ground through a gate resistor to define the voltage on the gate of the major LDSCR device.

4. An LDSCR ESD protection structure of claim 3, wherein the reference LDSCR device and major LDSCR device each include a p-well in which their respective sources are formed.

5. An LDSCR ESD protection structure of claim 4, wherein the gate resistor is defined by the inherent resistance of the p-well of the major LDSCR or includes a separate polysilicon resistor.

6. An LDSCR ESD protection structure of claim 5, wherein the reference LDSCR device includes a reduced surface field layer (RESURF layer), which defines a RESURF-composite overlap in the reference LDSCR device.

7. An LDSCR ESD protection structure of claim 6, wherein the RESURF layer in the reference LDSCR device is defined by the p-well of the reference LDSCR device or by another RESURF layer.

8. An LDSCR ESD protection structure of claim 7, wherein the major LDSCR device includes a RESURF layer, which defines a RESURF-composite overlap in the major LDSCR device.

9. An LDSCR ESD protection structure of claim 8, wherein the RESURF layer in the major LDSCR device is defined by the p-well of the major LDSCR device or by another RESURF layer.

10. An LDSCR ESD protection structure of claim 9, wherein the RESURF-composite overlap in the reference device is different from the RESURF-composite overlap in the major LDSCR device.

11. An LDSCR ESD protection structure of claim 10, wherein the reference LDSCR device is implemented as a self-triggering snapback device with the gate of the reference LDSCR device is connected to its source.

12. An LDSCR ESD protection structure of claim 11, wherein the relative RESURF-composite overlaps in the reference LDSCR device and the major LDSCR device are chosen to provide a lower triggering voltage in the reference LDSCR device than in the major LDSCR device.

* * * * *